(12) United States Patent
McInerney et al.

(10) Patent No.: US 7,103,079 B2
(45) Date of Patent: Sep. 5, 2006

(54) PULSED QUANTUM DOT LASER SYSTEM WITH LOW JITTER

(75) Inventors: John G. McInerney, County Cork (IE); Gregory L. Wojcik, Ben Lomond, CA (US); Lawrence C. West, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/878,481

(22) Filed: Jun. 28, 2004

(65) Prior Publication Data

US 2005/0008048 A1   Jan. 13, 2005

Related U.S. Application Data

(60) Provisional application No. 60/483,354, filed on Jun. 27, 2003.

(51) Int. Cl.
*H01S 3/00* (2006.01)

(52) U.S. Cl. ............... 372/38.02; 372/38.1; 372/18; 372/20

(58) Field of Classification Search ............... 372/38.1, 372/38.01, 20, 18, 38.02, 38.2
See application file for complete search history.

(56) References Cited

U.S. PATENT DOCUMENTS

| | | | |
|---|---|---|---|
| 4,100,562 A | 7/1978 | Sugawara et al. | |
| 4,368,481 A | 1/1983 | Ohashi et al. | |
| 4,438,447 A | 3/1984 | Copeland, III et al. | |
| 4,720,468 A | 1/1988 | Menigaux et al. | |
| 4,734,910 A | 3/1988 | Izadpanah | |
| 4,759,023 A | 7/1988 | Yamaguchi | |
| 4,918,497 A * | 4/1990 | Edmond | 257/77 |
| 4,959,540 A | 9/1990 | Fan et al. | |
| 4,980,568 A | 12/1990 | Merrick et al. | |
| 5,190,883 A | 3/1993 | Menigaux et al. | |
| 5,193,131 A | 3/1993 | Bruno | |
| 5,208,822 A | 5/1993 | Haus et al. | |
| 5,214,664 A | 5/1993 | Paoli | |
| 5,274,649 A | 12/1993 | Hirayama et al. | |
| 5,291,010 A | 3/1994 | Tsuji | |
| 5,298,787 A | 3/1994 | Bozler et al. | |
| 5,321,786 A | 6/1994 | Valette et al. | |
| 5,345,557 A | 9/1994 | Wendt | |
| 5,357,122 A | 10/1994 | Okubora et al. | |
| 5,382,810 A | 1/1995 | Isaksson | |
| 5,463,229 A | 10/1995 | Takase et al. | |
| 5,523,557 A | 6/1996 | Bruno | |
| 5,536,974 A | 7/1996 | Nishiguchi | |

(Continued)

OTHER PUBLICATIONS

Huang et al., Appl. Phys. Lett., vol. 78, pp. 2825-2827 (2001).

(Continued)

*Primary Examiner*—Minsun Oh Harvey
*Assistant Examiner*—Delma R. Flores-Ruiz
(74) *Attorney, Agent, or Firm*—Wilmer Cutler Pickering Hale LLP (57) ABSTRACT

A circuit for generating a clock or sampling signal, the circuit including: a semiconductor quantum dot laser element including a region of quantum dots, wherein the region of quantum dots is characterized by an emission distribution having a half-width of at least about 10 meV; and drive circuitry connected to the quantum dot laser element for operating the quantum dot laser element as a mode-locked laser that outputs a periodic, uniformly spaced sequence of pulses, wherein the clock or sampling signal is derived from the sequence of pulses.

20 Claims, 3 Drawing Sheets

U.S. PATENT DOCUMENTS

| | | | |
|---|---|---|---|
| 5,539,763 A | 7/1996 | Takemi et al. | |
| 5,548,433 A | 8/1996 | Smith | |
| 5,569,934 A | 10/1996 | Fujii et al. | |
| 5,604,361 A | 2/1997 | Isaksson | |
| 5,608,231 A * | 3/1997 | Ugajin et al. | 257/24 |
| 5,633,527 A | 5/1997 | Lear | |
| 5,663,592 A | 9/1997 | Miyazawa et al. | |
| 5,705,831 A * | 1/1998 | Uemura et al. | 257/78 |
| 5,710,436 A * | 1/1998 | Tanamoto et al. | 257/14 |
| 5,728,605 A | 3/1998 | Mizutani | |
| 5,767,508 A | 6/1998 | Masui et al. | |
| 5,801,872 A | 9/1998 | Tsuji | |
| 5,802,084 A | 9/1998 | Bowers et al. | |
| 5,812,574 A | 9/1998 | Takeuchi et al. | |
| 5,812,708 A | 9/1998 | Rao | |
| 5,825,051 A | 10/1998 | Bauer et al. | |
| 5,828,679 A | 10/1998 | Fisher | |
| 5,854,804 A | 12/1998 | Winer et al. | |
| 5,889,903 A | 3/1999 | Rao | |
| 5,945,720 A | 8/1999 | Itatani et al. | |
| 5,946,438 A | 8/1999 | Minot et al. | |
| 6,011,296 A | 1/2000 | Hassard et al. | |
| 6,031,243 A | 2/2000 | Taylor | |
| 6,031,859 A | 2/2000 | Nambu | 372/50 |
| 6,043,515 A | 3/2000 | Kamiguchi et al. | |
| 6,052,400 A * | 4/2000 | Nanbu et al. | 372/50.1 |
| 6,066,860 A | 5/2000 | Katayama et al. | |
| 6,093,939 A | 7/2000 | Artigue et al. | |
| 6,232,142 B1 | 5/2001 | Yasukawa | |
| 6,288,410 B1 | 9/2001 | Miyazawa | |
| 6,310,372 B1 | 10/2001 | Katayama et al. | |
| 6,318,901 B1 | 11/2001 | Heremans et al. | |
| 6,320,204 B1 | 11/2001 | Hirabayashi et al. | |
| 6,346,717 B1 | 2/2002 | Kawata | |
| 6,392,342 B1 | 5/2002 | Parikka | |
| 6,393,183 B1 | 5/2002 | Worley | |
| 6,403,395 B1 | 6/2002 | Hirabayashi et al. | |
| 6,407,438 B1 | 6/2002 | Severn | |
| 6,528,779 B1 | 3/2003 | Franz et al. | |
| 6,542,522 B1 | 4/2003 | Arahira | 372/18 |
| 6,600,169 B1 * | 7/2003 | Stintz et al. | 257/14 |
| 6,625,337 B1 * | 9/2003 | Akiyama | 385/14 |
| 6,628,691 B1 * | 9/2003 | Hatori | 372/50 |
| 6,645,829 B1 | 11/2003 | Fitzergald | |
| 6,677,655 B1 | 1/2004 | Fitzergald | |
| 6,680,495 B1 | 1/2004 | Fitzergald | |
| 6,701,049 B1 * | 3/2004 | Awad et al. | 385/122 |
| 6,816,525 B1 * | 11/2004 | Stintz et al. | 372/45 |
| 6,984,846 B1 * | 1/2006 | Newns et al. | 257/31 |
| 2001/0028755 A1 | 10/2001 | Akiyama | |
| 2002/0085605 A1 | 7/2002 | Hatori | |
| 2002/0114367 A1 | 8/2002 | Stintz | 372/45 |
| 2003/0015720 A1 | 1/2003 | Lian et al. | |
| 2003/0025118 A1 | 2/2003 | Yamazaki et al. | |
| 2004/0109633 A1 * | 6/2004 | Pittman et al. | 385/16 |

OTHER PUBLICATIONS

Jinno, IEEE Phot. Tech. Lett., vol. 5, pp. 1140-1143 (1993).
Leonard et al., Appl. Phys. Lett., vol. 64, pp. 3203-3205 (1993).
Lester et al., IEEE Phot. Tech. Lett., vol. 11, pp. 931-933 (1999).
Liu et al., IEEE Quan. Elec., vol. 25, pp. 1417-1425 (1989).
Madhukar et al., Appl. Phys. Lett., vol. 64, pp. 2727-2729 (1994).
Moison et al., Appl. Phys. Lett., vol. 64, pp. 196-198 (1994).
Reithmaier et al., IEEE Selec. Top. In Quan. Elec., vol. 8, pp. 1035-1044 (2002).
Shoji et al., IEEE Selec. Top. In Quan. Elec., vol. 3, pp. 188-195 (1997).
Sogawa et al., IEEE Quan. Elec., vol. 27, pp. 1648-1654 (1991).
Avrutin, E.A., et al., "Monolithic and Multi-GigaHertz Mode-Locked Semiconductor Lasers: Constructions, Experiments, Models and Applications," IEE Proc.-Optoelectron., 2000, vol. 147(4), pp. 251-278.
Fan, H. et al., "Colliding Pulse Mode Locked Laser," IEEE, 1999, pp. 701-702.
Haring, R., et al. "High-Power Passively Mode-Locked Semiconductor Laser," IEEE J of Quantum Electronics, 2002, vol. 38(9), pp. 1268-1275.
Tamura, K. R. et al., "Modulation Requirements and Transmission Characteristics of Electrically Tunable Mode-Locked Lasers With Fiber Bragg Gratings," IEEE Photonoics Technology Letters, 2002, vol. 14(6), pp. 834-836.
Yokoyama, H., et al. "Highly Reliable Mode-Locked Semiconductor Lasers and Their Applications," Photonic and Wireless Devices Research Laboratories, NEC Corporation, Japan.

* cited by examiner

PULSED QUANTUM DOT LASER SYSTEM WITH LOW JITTER

This application claims the benefit of U.S. Provisional Application No. 60/483,354, filed Jun. 27, 2003.

TECHNICAL FIELD

This invention relates to quantum dot lasers and their applications.

BACKGROUND OF THE INVENTION

Quantum dots are three-dimensional semiconductor structures that confine electrons and holes in 3-dimensions and thereby produce energy quantization. Quantum dots are so small that quantum mechanical effects come into play in controlling their behavior. The "dots," which up close actually appear to be more pyramidal in shape, have base dimensions on the order of about 200 Å and height dimensions of about 80 Å.

Some years ago, the scientific community realized that one could make a new type of semiconductor laser by using quantum dots in the active layer. Those new lasers, referred to as quantum dot lasers, held out the promise of great benefits. For example, it was expected that the quantum dot lasers would exhibit less-temperature dependent performance, reduced threshold currents, and more efficient operation than existing semiconductor lasers.

Quantum dot lasers work like other semiconductor lasers. Like the semiconductor laser, the goal of a quantum dot laser is to excite the material into a high energy state and then induce it back into its low energy state resulting in a net release of energy, which emerges as a photon.

One technique for fabricating quantum dot lasers involved forming a layer of quantum dots during Molecular Beam Epitaxy (MBE) growth by a self-assembly method known as the Stranski-Krastanov process. Initial layers are grown lattice matched (or coherently strained) to a substrate material. Following the deposition of the active region, a quantum dot layer is then deposited and quantum dots (e.g. InAs) are formed. Completing the laser structure involves depositing further material layers that are lattice matched to the substrate. Other than the quantum dot layer, the preceding and subsequent material layers are really no different than existing semiconductor structures. However, it is the thin layer of quantum dots that holds out the promise of a new level of semiconductor laser performance.

For some people within the community of researchers of quantum dot lasers, it has been the view that being able to establish highly dense and highly uniform quantum dots was essential for achieving the benefits that were predicted for quantum dot lasers. So, part of the research community has put effort into improving the uniformity of the quantum dot layers.

SUMMARY OF THE INVENTION

In general, in one aspect, the invention features a pulsed laser or laser system with low phase noise resulting in low jitter. The laser includes a region of quantum dots (e.g. the gain section) made of, for example, InAs or InGaAs grown on GaAs, AlGaAs or InGaAs. The quantum dots within that region are grown so as to produce a continuous distribution of sizes, shapes, compositions, and/or environments randomly arranged throughout the region. This random and relatively broad distribution of quantum dots achieves automatic matching with cavity resonance. That, in combination with also taking additional measures and/or optionally including additional sections within the laser for phase or wavelength control and amplification results in very low jitter. This particular category of quantum dot (QD) laser diodes has the advantage of being capable of generating reduced or low jitter without the need for a phase noise reduction loop. Thus, in this case, the laser or laser system lends itself to being specifically applied to generating an optical clock or sampling signal for which low jitter is an important requirement.

The pulsed laser diodes that include quantum dots having a broad distribution of sizes enable one to generate optical clock signals with high precision, i.e., characterized by short pulses, high repetition (clock) rates, and low jitter (variation in inter-pulse time interval and amplitude).

Some of the QD laser diodes of the type described herein are grown on a GaAs (gallium arsenide) substrate to operate at wavelengths in the transparency range of bulk silicon (i.e., longer than 1100 nm). In comparison, conventional (e.g. bulk and quantum well) laser diodes that are designed to emit in that wavelength range require InGaAsP (indium gallium arsenide phosphide) or other quaternary alloys lattice-matched to InP (indium phosphide) substrates. Because GaAs based growth and fabrication processes are much more developed, have higher production yields, and are lower cost than the InP based growth and fabrication processes, this represents a significant advantage.

In addition, compared to InP based lasers, QD laser diodes of the type described herein offer lower dependence on ambient temperature and thereby permit simplification or elimination of the customary temperature controls used in laser diode systems. They may be made less sensitive to optical feedback reflections and thereby permit simplification or elimination of the customary optical isolation used in laser diode systems. What is especially novel is the application of single or coupled quantum dot lasers to optical clocking or data sampling, given the importance of reduced temperature sensitivity, reduced feedback instabilities, low jitter, silicon transparency wavelength range, and low cost high volume production based on gallium arsenide technology.

The concepts described herein are described with specific application to optical clock generation and sampling, and may incorporate additional measures or sections for phase or wavelength control and amplification for low jitter. As a laser system it may include two or more coupled lasers and amplifiers.

In general, in one aspect, the invention features a circuit for generating a clock or sampling signal. The circuit includes: a semiconductor quantum dot laser element including a region of quantum dots, wherein the region of quantum dots is characterized by an emission distribution having a half-width of at least about 10 meV; and drive circuitry connected to the quantum dot laser element for operating the quantum dot laser element as a mode-locked laser that outputs a periodic, uniformly spaced sequence of pulses, wherein the clock or sampling signal is derived from the sequence of pulses.

Embodiments include one or more of the following features. The circuit also includes other circuitry to which the clock or sampling signal is supplied for purposes of clocking or sampling. The halfwidth of the emission distribution is greater than about 30 meV or 50 meV. The quantum dot laser includes a gain section and the region of quantum dots is part of the gain section. The quantum dot laser includes a gain section and a second section that is either an absorber section or an optical waveguide section, and wherein the region of quantum dots is in the second section. The quantum dot laser includes a gain section, an absorber section, and optical waveguide section, and wherein the region of quantum dots is in one of the gain, absorber or waveguide sections. The optical waveguide section is an optical waveguide tuning section. The quantum dot laser includes a grating for selecting or rejecting certain wavelengths. The quantum dot laser includes a phase tuning section for cavity tuning. The quantum dot laser includes a phase modulator section for frequency shifting. The drive circuitry is configured to operate the quantum dot laser element as an actively mode-locked laser. Or alternatively, the drive circuitry is configured to operate the quantum dot laser element as a passively mode-locked laser.

In general, in another aspect, the invention features a circuit including: a semiconductor quantum dot laser element including a region of quantum dots, wherein the region of quantum dots is characterized by an emission distribution having a half-width of at least about 10 meV; and drive circuitry connected to the quantum dot laser element for operating the quantum dot laser element as a mode-locked laser that outputs a periodic, uniformly spaced sequence of pulses that is characterized by jitter of less than about 1 picosecond.

In general, in yet another aspect, the invention features a circuit including: a semiconductor quantum dot laser element including a region of quantum dots, wherein the region of quantum dots is characterized by an emission distribution having a half-width of at least about 10 meV; and drive circuitry connected to the quantum dot laser element for operating the quantum dot laser element as a gain switched laser.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
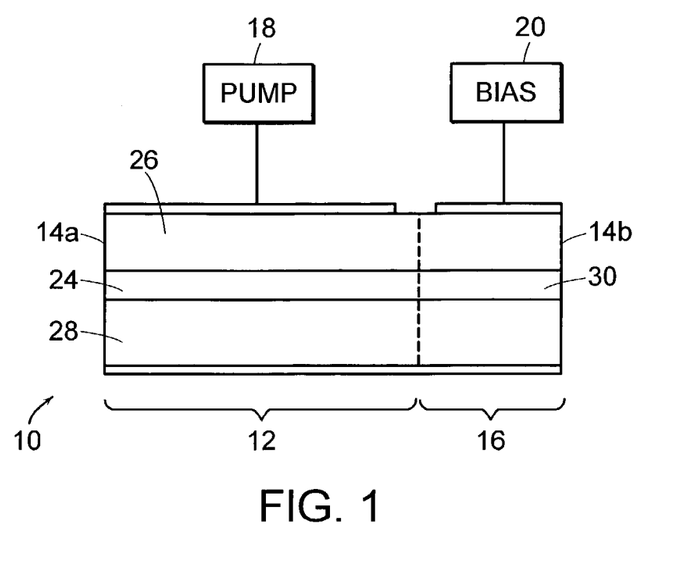
FIG. 1 is a diagram of a quantum dot laser diode in a passive mode-locking circuit.

Referring to FIG. 1, one exemplary embodiment is a laser diode 10 which incorporates into its structure at least one region having a broad random statistical distribution of quantum dots of different sizes, shapes, compositions, and/or environments. As will be discussed in greater detail below, this broad distribution of quantum dots produces in the laser diode structure a correspondingly broad distribution of emission wavelengths which, in turn, greatly facilitates matching to cavity modes within the laser diode.

Laser diode 10 includes an optically amplifying medium forming a gain element or gain section 12 within a cavity formed by two partially reflecting surfaces or mirrors 14a and 14b located on opposite sides of the device. Mirrors 14a and 14b can be formed by cleaving the ends of the device to form surfaces which contact the air and produce a reflectivity of about 30%. Mirrors 14a and 14b provide optical feedback according to which a portion of the amplified light is reflected back through the gain section. Laser diode 10 also includes an absorber section 16, which is typically biased to be made more absorbing than the gain region. Absorber section 16 is a saturable region, which means that its absorption coefficient decreases upon absorption of light.

Except for fabricating the quantum dot material, both gain section 12 and absorber section 16 can be fabricated in ways that are similar to those that are currently used by persons of ordinary skill in the art to fabricate quantum dot laser diodes. (See, for example, the references that were cited above in the Background.) For example, the composition of layers, layer thicknesses, and number of layers can be similar to what others have been using to manufacture quantum dot lasers. In general, gain section 12 typically includes a gain medium 24 that is sandwiched between upper and lower cladding layers 26 and 28 that are of opposite conductivity types (e.g. one is N-type and the other is P-type). The structure of absorber section 16 is similar, with an absorber material 30 that is also sandwiched between upper and lower cladding layers 26 and 28. In both gain section 12 and absorber section 16, the regions between upper and lower cladding layers 26 and 28 form wave guiding channels that tend to constrain the light to within the channels.

A pump source 18 supplies energy (e.g. injected current) to gain section 12 to produce sufficient numbers of excited species (e.g. electrons or holes) for generating optical gain. And a bias source 20 applies an appropriate bias (e.g. voltage) to absorber section 16. When the optical gain exceeds the total optical losses, including losses from light attenuation due to scattering, absorption and emission, a lasing threshold is attained above which the laser oscillates self-sufficiently.

In general, within the laser diode during operation there will be self-consistent electromagnetic field patterns and associated frequencies which match both the gain spectrum of the device and the cavity feedback conditions. These will define laser modes of oscillation with specific conditions applied to longitudinal modes, which are various field pattern variations in the direction of dominant light propagation, and transverse modes, which are various field pattern variations perpendicular to the direction of dominant light propagation. In general, the laser modes occur at frequencies that are equal to integer multiples of the inverse of the round trip time of the light in the cavity. In essence, when all of the modes within the cavity line up the intensity becomes large enough to "burn" through the absorber and produce a laser beam out of the device.

In this described embodiment, only the gain section incorporates the quantum dots into its gain medium, though they could be located in other sections or in multiple sections.

Quantum Dot Distributions

The quantum dots which have been referred to in the above description are, as is well known to persons of ordinary skill in the art, three-dimensional structures for confining electrons and holes to dimensions appropriate for energy quantization. The band gap or transition energies associated with quantum dots are dependent on several factors, including their size, their shape, their composition, and the environment in which they are formed.

Figure 6:
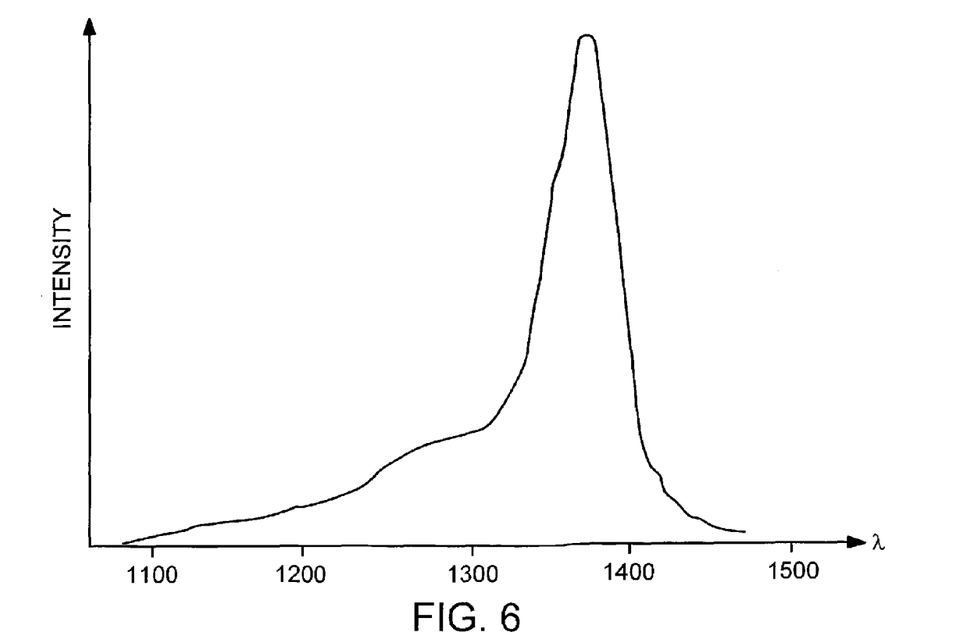
FIG. 6 is a representative emission spectrum of a quantum dot region showing a peak emission at about 1380 nm.

The quantum dots are fabricated to produce a broad distribution of closely spaced quantum dot emission wavelengths. This is achieved by growing quantum dots so that they have a statistically random distribution of characteristics (e.g. some combination of size, shape, composition and/or environment). Such a distribution will cause the emission energies to also be distributed over a range of energies. The resulting distribution of energies is centered about a central wavelength and tails off on either side of that wavelength and the individual emission lines which make up the distribution are continuously distributed over that range. It is not known precisely, however, what the distribution is though it appears to be Gaussian-like, though unsymmetrical about the peak wavelength, as shown in FIG. 6. (FIG. 6 shows a representative emission spectrum for a quantum dot region having a peak emission at about 1380 nm.)

The resulting distribution in transition energies for the population of quantum dots will have a characteristic width as measured between the two (high and low) energy points where the optical emission strength from the dots has reduced by half of the peak emission. It is desirable to produce an energy distribution that is broader than about 10 meV and possibly even multiples of ten meV (e.g. 30 or 50 meV or more). It is desirable that the growth technique be controlled to produce a sufficient number of quantum dots of different size to produce all of the desired frequencies, e.g. the cavity mode frequencies, while providing sufficient numbers of dots emitting at the desired frequency or wavelength for laser oscillation to occur with low threshold and high efficiency.

Quantum dots are most commonly grown by the self-organized Stranski-Krastanov (S-K) technique which can naturally produce a broad distribution of quantum dot sizes and shapes, with characteristic effective bandgap energy halfwidths of ~30–50 meV. The S-K technique is well described in the scientific literature to which the reader is directed for further information. Two articles which are representative of the publicly available information about the S-K technique include:
  1. Shoji, H.; Nakata, Y.; Mukai, K.; Sugiyama, Y.; Sugawara, M.; Yokoyama, N.; Ishikawa, H. "Lasing characteristics of self-formed quantum-dot lasers with multistacked dot layer," IEEE J Selected Topics in Quantum Electronics, Vol. 3, pp.188–195 (1997);
  2. Reithmaier, J. P.; Forchel, A, "Single-mode distributed feedback and microlasers based on quantum-dot gain material," IEEE J. Selected Topics in Quantum Electronics, Vol. 8, pp.1035–44 (2002).

There are also many detailed references in the literature on thermodynamics, growth kinetics, and characterization of self-organized quantum dots. Three examples of such references which discuss the first successful S-K growth of quantum dots are:
  1. D. Leonard, M. Krishnamurthy, C M Reaves, S. P. DenBaars, P. M. Petroff, Appl. Phys. Lett. vol. 63, p. 3202 (1993);
  2. J. M. Moison, F. Houzay, F. Barthe, L. Leprince, E. Andre, O. Vatel, ibid vol. 64, p. 196 (1994); and
  3. A. Madhukar, Q. Xie, P. Chen, A. Konkar, ibid vol. 64, p. 2727 (1994).

Although in some situations it may be advantageous to produce narrower size or shape distributions, with bandgap energy halfwidth ~10 meV or less, in the embodiments described herein broader size distributions, corresponding to several tens of meV in energy bandgap spread are advantageous, typically 50 meV. This is due to the highly dispersive laser cavities involved, and the tendency for the exact cavity resonances to vary with operating parameters, with age and due to variations in production materials and processes. The broad distribution of quantum dot sizes ensures spectral matching of the quantum dot emission with respect to the cavity, with the gain or absorption line having low refractive index variation as a function of emission wavelength and manufacturing variations, which ensures a robust and reproducible low-threshold, low-jitter solution for most lasers or coupled-laser systems.

Passive Mode-Locking

The bias and control circuitry in FIG. 1 biases laser diode 10 so that it operates as a mode-locked laser. As is generally known, a mode-locked laser is one in which several modes (usually longitudinal modes) are phase-locked, that is constrained to have a fixed phase relationship with each other. Such locking results in the laser light output becoming a series of rapid pulses separated by well-defined time intervals. These pulses build up over many transits through the laser cavity.

Locking modes generally requires coupling energy between them. This may be accomplished in at least two distinct ways, namely, through active mode-locking or through passive mode-locking. In active mode-locking, the system gain or loss is modulated at a frequency commensurate with one or more mode spacings which results in each mode generating side modes which overlap with other modes. In passive mode-locking such sidebands are generated by virtue of nonlinear interactions such as sum and difference frequency generation between different modes, for example in a saturable absorber or other nonlinear optical medium. Lasers employing combinations of active and passive mode-locking, that is combinations of gain or loss modulation and nonlinear mode coupling, are said to undergo hybrid mode-locking.

The embodiment shown in FIG. 1 is operated in a passive mode-locking regime. Thus, a fixed forward bias is applied to gain section 12 by pump source 18 and a reverse bias is applied to absorber section 16 by bias source 20. When the gain and absorber sections are both biased at steady values (the gain with a forward current, the absorber with a reverse voltage) the laser is passively mode-locked and emits pulses with the required characteristics for certain choices of the laser design and operating parameters.

Because of the broad distribution of the quantum dot emission wavelengths, particularly in a random statistical distribution of quantum dot widths, shapes or transition energies, matching of the gain or loss spectral peak to the laser cavity modes is greatly simplified. This implies that mode locking (or gain switching which is discussed later) is readily achieved, that the desired operating point will be robust with respect to the operating parameters, and that high volume manufacturing should be possible with high production yields. In contrast, schemes which employ narrow size distributions in the quantum dot gain medium, such as is described in U.S. Pat. No. 6,031,859 to Nambu, require careful matching between size and cavity dispersion, and therefore require careful tuning for mode locking, all of which would result in significantly reduced production yields during high volume manufacturing.

For certain ranges of values of the parameters (e.g. gain, absorption, modulation, phase tuning), the laser emits trains of low-jitter ultrashort pulses. In general, these parameters may correspond to low values of the linewidth enhancement factor resulting from an effectively symmetric gain lineshape. The low-jitter performance may be accomplished by a combination of adjusting the laser drive current, the composition and shape and barrier material of the quantum dots, and the detuning of the cavity modes from the gain peak wavelength. Another potentially useful parameter is cavity dispersion which can be adjusted to yield differential saturation of absorption and gain in the mode-locked state, in effect causing the absorption to saturate or bleach at a lower intensity and an earlier time than the onset of saturation of the gain. Adjustment of cavity gain, loss, and dispersion are techniques known to those skilled in the art of pulsed laser design for optimizing laser performance.

Establishment of mode-locked operation may be achieved by first applying a reverse bias to absorber section 16. The exact initial value of the bias depends on its vertical thickness and the length of absorber section 16 in comparison to gain section 12; but typically it is in the range 1–10 V. Gain section 12 is then forward biased until the laser threshold is exceeded and the desired average optical power is obtained. Following this, the absorber bias is adjusted so as to produce intensity pulsations as viewed using a fast optical signal detector such as a photodiode coupled to a fast sampling oscilloscope or electronic spectrum analyzer. Further fine adjustment of gain current and absorber bias may then be carried out to obtain pulse widths in the desired range.

Jitter is measured by recording and integrating residual phase noise spectra at offset frequencies spanning a specific defined range such as 30 kHz–10 MHz. Further adjustment of gain current and absorber bias may be necessary to reduce the measured jitter to a desired value, e.g. ~1 ps or less. If the laser diode includes other sections, such as a phase tuning section, the current or voltage applied to this other section may also be varied to adjust pulse widths and/or timing jitter to achieve desired performance.

As an indication of typical performance of such lasers, pulses ~10 ps wide with time-bandwidth products ~1 at repetition frequencies 5–10 GHz and timing jitter as low as 0.3–0.4 picoseconds achievable and sub-picosecond performance routinely achievable by passive mode-locking. Such pulse widths are measurable using intensity auto-correlation or other well-known means. Timing jitter is measured by integrating residual phase noise spectra over a range of offset frequencies typically 30 kHz–10 MHz.

Clock Generation Circuit

Figure 2:
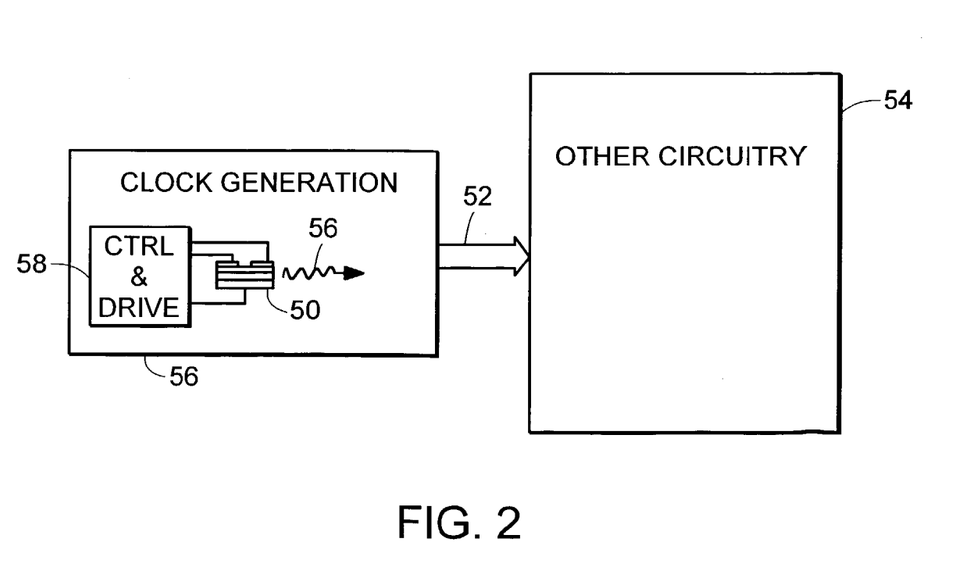
FIG. 2 is a block diagram of a system in which a quantum dot laser diode is used to generate the clock signal for another circuit.

FIG. 2 illustrates in block diagram form, a system which uses a QD laser 50, such as is described herein, to generate an optical clock signal 52 for other circuit 54. The system includes a clock generation module 56 which includes within it QD laser 50 as the source of an optical signal 56 from which optical clock signal 52 is derived. There is also an appropriate control and drive circuit 58 for causing QD laser 50 to operate in the desired mode and with the desired signal characteristics, e.g. low jitter, etc. In this embodiment, QD laser 50 is operated in an active mode-locked mode, so control and drive circuit 58 supplies both an appropriate bias signal to the absorber section and a modulated drive signal to the gain section. To use the periodic signal from the mode-locked QD diode laser as a clock signal, the time interval between pulses should vary by less than a few percent. That is, the clock repetition rate needs to be constant within a few percent, i.e., it needs to have low jitter.

Other circuit 54 is meant to represent any system that requires an optical clock signal. It is envisioned that a particularly useful application of clock generation circuit 56 is in connection with circuits that are fabricated on optical ready substrates, such as are described in detail in U.S. patent application Ser. No. 10/280,505, filed Oct. 25, 2002, entitled "Optical Ready Substrates," and U.S. patent application Ser. No. 10/280,492, filed Oct. 25, 2002, entitled "Optical Ready Wafers," both of which are incorporated herein by reference. In general, the optical ready substrate, like other conventional semiconductor substrates, is a substrate that is ready to have the microelectronic circuitry fabricated on it by using conventional fabrication processes such as the CMOS process. However, unlike conventional substrates, the optical ready substrate includes optical signal distribution circuitry already fabricated into it, typically in a layer below the layer that is to receive the microelectronic circuitry.

It is also envisioned that clock generation circuit 56 can be either an integral part of or completely separate from other circuit 54. For example, if other circuit 54 is fabricated on an individual chip, clock generation circuit 56 can also be fabricated on that same chip. Or alternatively, clock generation circuit 54 could be fabricated on a separate chip and the optical clock signal delivered to the other chip via fiber optics or other appropriate means.

The intrinsic physics of quantum dots provides significant advantages in reducing timing and amplitude jitter and pulse chirp (i.e., dynamic spectral broadening and/or shifting due to modulation) in pulsed laser diodes. Exploitation of this effect is enhanced in a dispersive cavity with quantum dots having a broad statistical size distribution as can be achieved, for example, when grown using Stranski-Krastanov schemes.

Low timing jitter implies well-behaved modes with sharp and definite characteristic frequencies which may be matched effectively to cavity resonances, external modulation or light coupling, or synchronized by coupling to another pulse train, or other means intended to generate or stabilize the pulses. By contrast, pulse trains with large jitter have frequency spectra with broad and possibly unstable peaks which are less easily or effectively locked, synchronized or stabilized and may be expected to vary more sensitively with operating parameters. As a rough estimate, these advantages should be significant when the jitter is less than ten percent of the inter-pulse period.

A key factor in determining amplitude and phase noise, and hence pulse amplitude jitter and timing jitter, is the carrier-induced index change at the lasing or absorbing wavelength. In lasers this effect is characterized by the linewidth enhancement factor (also called the anti-guiding parameter or alpha-parameter). This parameter is instrumental in many dynamical effects of laser diodes such as linewidth broadening, modulation-induced chirp, self-focusing and beam flicker, sensitivity to temperature and optical feedback.

Reducing the carrier-induced index change has major advantages in producing narrower and more stable spectra, enabling high speed direct modulation without an external modulator, and simplifying or eliminating heat sinking, thermal control and optical isolation systems which are customary in laser diode applications. These benefits are all real and significant, but most significant of all for applications involving optical clocking, sampling and signal transmission or processing is that the reduced index change should result in smaller inter-pulse phase shifts which are directly related to pulse jitter, or variation in inter-pulse time intervals. This leads to the benefits of low jitter described above.

Lasers incorporating quantum dots are capable of producing reduced linewidth enhancement factors over conventional bulk and quantum well lasers. This is due to the more symmetrical, atomic-like gain line produced by quantum dots before the onset of saturation. Since line asymmetry is a major contributor to the linewidth enhancement factor, its reduction is part of the intrinsic physics of quantum dots which also permits zero or even negative values of this parameter for particular special combinations of the material and cavity parameters.

Absorbers incorporating quantum dots should also exhibit a reduced index change for similar reasons. Although there is no equivalent to the alpha parameter for absorption, identical effects hold true. The reduced index change results in lower phase noise in the laser cavity and hence reduced pulse jitter. For waveguide sections containing quantum dots, the optical scatter and free carrier absorption should be reduced, allowing the use of lower carrier densities in the gain section(s) and hence to lower threshold currents. In the mode-locked or switched-pulse regimes this implies less absorption or modulation depth and jitter.

Active Mode-Locking

Figure 3:
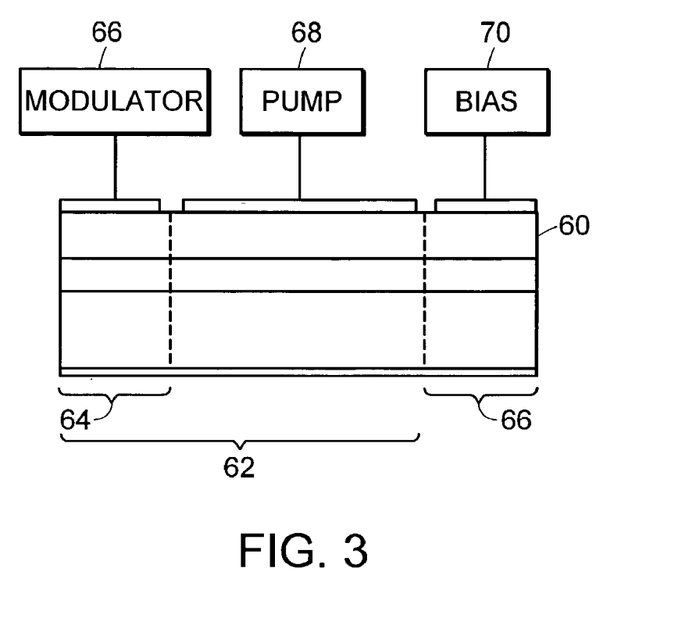
FIG. 3 is a diagram of a quantum dot laser diode in an active mode-locking circuit.

A circuit which implements active mode-locking is shown in FIG. 3. In this circuit, the QD diode laser 60 has three sections, namely, an active gain section 62, a portion of which is used as a gain modulator region (modulator section) 64, and an optional saturable absorption section 66. The control and drive circuitry includes a modulation circuit 66 which modulates modulator section 64, a pump circuit 68 which supplies energy (e.g. injects direct current) to gain section 62 and a bias circuit 70 which reverse biases absorption section 66. To drive the inherent modes of the cavity, modulation circuit 66 modulates the device at a frequency that is some integer multiple of the inverse of the round trip time and with a modulation depth adjusted to get the desired performance.

There are of course many other configurations of an actively mode locked laser circuit that could be used depending in part on the design of the QD laser diode. For example, one could instead modulate the absorption section.

Alternative Embodiments of the QD Laser Diode Structure

There are other optional optical elements that can be included in the laser diode structure, and more specifically, in the optical path defined by the laser diode structure. For example, an optional waveguide section can be added. It is customary to use an optical waveguide to inhibit the diffraction of the propagating light. Although this is not strictly necessary, it helps reduce losses and increase efficiency. If an optical waveguide is used between and/or in addition to the gain and absorber section, by making it an optical waveguide tuning section one can use it to vary the relative phase of the optical field between these locations. An optional grating, such as a distributed Bragg grating or other dispersive element such as an etalon or wavelength selective loss element, may also be provided for the purpose of selecting or rejecting certain wavelengths or bands of wavelengths. Also, an optional passive section may be included to allow the overall cavity length to be extended without necessarily extending the gain and/or absorber or modulator sections. The cavity may be folded to reduce the laser chip length, or coupled from the chip to an external cavity, or some combination of chip and external cavity. All the above elements may be employed for tuning, wavelength stabilization, or control of pulse width or jitter by controlling overall cavity dispersion.

Other optional additional sections may be incorporated for phase or spectral control or for further amplification of the light. For example, a phase tuning section or phase modulator may be included for cavity tuning or frequency shifting. An amplifier section may be added consisting of a section of material pumped above transparency so that it provides optical gain for the pulse trains. An electro-optic, electro-absorption or other switch or modulator section may be included to allow switching, modulation or gating of pulses.

In addition, the quantum dots need not be present in only the gain section. The pulsed laser diode or coupled laser diode system can incorporate quantum dots in any one or more of the gain, waveguide, modulator and/or absorber sections.

In contrast to other applications of pulsed laser diodes, the QD laser diodes described herein are tuned for minimum jitter, or alternatively for most consistent pulse width and/or jitter over a wide range of temperature, drive current/voltage or other operating parameters, and hence most effective generation of optical clock or sampling pulses, especially in low cost high volume manufacturing. The laser is tuned by its operating parameters (drive current and absorber voltage if an absorber section is used), temperature and possibly additional control inputs such as current or voltage through an optional tuning section. The laser is tuned for minimum or most robust jitter by empirical test.

Several possible pulsing regimes are envisioned for the QD laser diodes described herein, including switching (e.g. strong modulation of gain and/or loss), mode locking (e.g. forced coupling between longitudinal modes), injection seeding or locking (e.g. optical signal injected from one laser to another), mixing (e.g. mutual coupling between lasers), synchronous pumping (e.g. use of one pulsed laser to pump another), synchronous oscillation (e.g. using one pulsed laser to trigger or synchronize the pulses from another) and optoelectronic oscillation (e.g. external optical and/or electronic control loop participates in pulse generation).

These may involve one or more lasers which may be coupled to each other and/or amplifiers and/or optical cavities including microcavities and/or waveguides including grating sections or photonic crystals. Multiple pulsed lasers may be combined to create multiplexed channels distinguished by wavelength, time, polarization, spatial position or direction, or other means.

Each gain section develops laser action and may couple light into an absorber section in which the absorption is saturable (i.e., decreases as more light is absorbed) until some saturation or transparency point is reached, and/or into a modulator section whose properties are varied by an external electrical or optical signal. The function of these sections may be combined, for example a gain or absorber section modulated to form a modulator section, or operated in a transparency regime as a waveguide section.

Figure 4A:
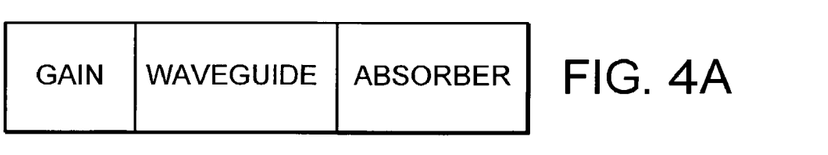
FIG. 4A–C show alternative configurations of a quantum dot laser diode according to the present invention.
Figure 4B:
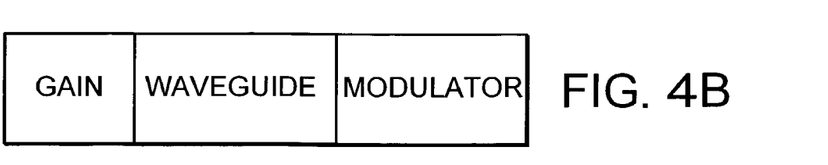
Figure 4C:
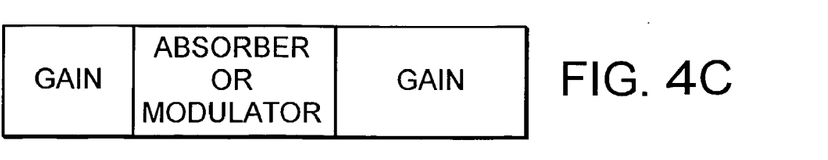

FIGS. 4A–C show other possible multi-section laser designs featuring some or all of these various sections. The device of FIG. 4A includes a gain section and an absorber section separated by a waveguide section. The device of FIG. 4B includes a gain section and a modulator section (which could be either an absorber section or another gain section) separated by a waveguide section. And the device of FIG. 4C includes two gain sections separated by a modulator or absorber section. These examples are not intended to be exhaustive but only illustrative of the variety of combinations that could be fabricated.

Figure 5A:
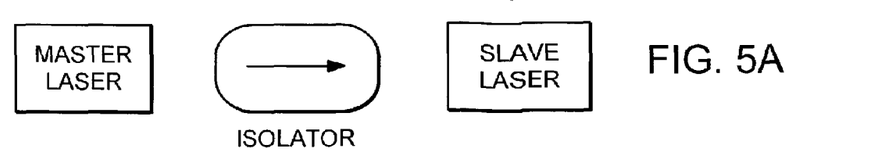
FIG. 5A–C show alternative arrangements of one or more quantum dot laser diodes.
Figure 5B:
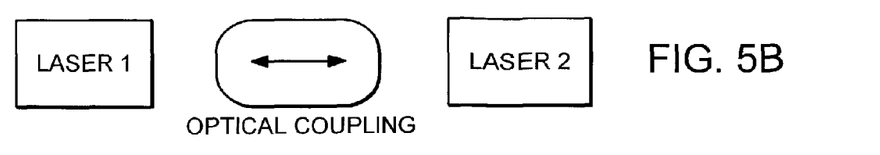
Figure 5C:
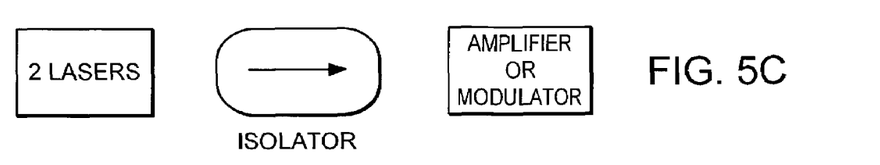

FIGS. 5A–C show systems that include two unidirectionally coupled lasers in the so-called injection locking (FIG. 5A) and synchronous-pumping configurations (FIG. 5B), and two bi-directionally (mutually) coupled lasers which may involve a common external cavity (FIG. 5C). These concepts may readily be extended to more than two lasers.

Gain Switching

A gain-switched laser is one in which the optical gain is switched on and off rapidly, that is modulated at large modulation depth, usually with a timing which corresponds to exciting only a single short pulse of light or a train of such pulses. The laser is then switched off and may be excited again by another burst of modulation of the optical gain, which is applied after a minimum recovery time has elapsed.

In the switching regime the pulse period is that of the modulating source, in contrast to the mode locking regime in which it is an integer multiple or sub-multiple of the time delay in a single optical round trip in the laser cavity. The cavity may be folded or angled to reduce the laser chip length, or coupled from the chip to an external cavity, or some combination of chip and external cavity.

The QD laser diode can also be used in gain switched configurations to achieve low jitter and other improved performance though it is less likely that benefits achieved in the area of low jitter would be as great as are achievable in the mode locked configurations.

Other embodiments are within the following claims. For example, other substrate materials may also be used, and the utility of the scheme is applicable to any wavelength at which quantum dots can be grown to emit. In addition, one can use quantum dots of materials other than InGaAsP, for example, InAS or InGaAs grown on GaAs, AlGaAs or InGaAs. Also, the broad gain spectrum that is achieved through the quantum dot growth process could be also or alternatively be used for greater wavelength tunability.

What is claimed is:

1. A circuit for generating a clock or sampling signal, said circuit comprising:
    a semiconductor quantum dot laser element including a region of quantum dots, wherein the region of quantum dots is characterized by an emission distribution having a half-width of at least about 10 meV; and
    drive circuitry connected to the quantum dot laser element for operating the quantum dot laser element as a mode-locked laser that outputs a periodic, uniformly spaced sequence of optical pulses, wherein the clock or sampling signal is derived from the sequence of optical pulses, and wherein said circuit is configured to generate the sequence of optical pulses without any external optical signal being provided as an input signal.

2. The circuit of claim 1, further comprising other circuitry to which the clock or sampling signal is supplied for purposes of clocking or sampling.

3. The circuit of claim 1, wherein the halfwidth of the emission distribution is greater than about 30 meV.

4. The circuit of claim 1, wherein the halfwidth of the emission distribution is greater than about 50 meV.

5. The circuit of claim 1, wherein the quantum dot laser element includes a gain section and the region of quantum dots is part of the gain section.

6. The circuit of claim 1, wherein the quantum dot laser element includes a gain section and a second section that is either an absorber section or an optical waveguide section, and wherein the region of quantum dots is in the second section.

7. A circuit for generating a clock or sampling signal, said circuit comprising:
    a semiconductor quantum dot laser element including a region of quantum dots, wherein the region of quantum dots is characterized by an emission distribution having a half-width of at least about 10 meV; and
    drive circuitry connected to the quantum dot laser element for operating the quantum dot laser element as a mode-locked laser that outputs a periodic, uniformly spaced sequence of optical pulses, wherein the clock or sampling signal is derived from the sequence of optical pulses, wherein the quantum dot laser element includes a gain section, an absorber section, and optical waveguide section, and wherein the region of quantum dots is in one of the gain, absorber or waveguide sections.

8. The circuit of claim 7, wherein the optical waveguide section is an optical waveguide tuning section.

9. The circuit of claim 1, wherein the quantum dot laser element includes a grating for selecting or rejecting certain wavelengths.

10. A circuit for generating a clock or sampling signal, said circuit comprising:
    semiconductor quantum dot laser element including a region of quantum dots, wherein the region of quantum dots is characterized by an emission distribution having a half-width of at least about 10 meV; and
    drive circuitry connected to the quantum dot laser element for operating the quantum dot laser element as a mode-locked laser that outputs a periodic, uniformly spaced sequence of optical pulses, wherein the clock or sampling signal is derived from the sequence of optical pulses, wherein the quantum dot laser element includes a phase tuning section for cavity tuning.

11. The circuit of claim 1, wherein the quantum dot laser element includes a phase modulator section for frequency shifting.

12. The circuit of claim 1, wherein the drive circuitry is configured to operate the quantum dot laser element as an actively mode-locked laser.

13. The circuit of claim 1, wherein the drive circuitry is configured to operate the quantum dot laser element as a passively mode-locked laser.

14. A circuit comprising:
    a semiconductor quantum dot laser element including a region of quantum dots, wherein the region of quantum dots is characterized by an emission distribution having a half-width of at least about 10 meV; and
    drive circuitry connected to the quantum dot laser element for operating the quantum dot laser element as a mode-locked laser that outputs a periodic, uniformly spaced sequence of pulses that is characterized by jitter of less than about 1 picosecond.

15. The circuit of claim 14, wherein the halfwidth of the emission distribution is greater than about 30 meV.

16. The circuit of claim 14, wherein the halfwidth of the emission distribution is greater than about 50 meV.

17. The circuit of claim 14, wherein the quantum dot laser includes a gain section and the region of quantum dots is part of the gain section.

18. The circuit of claim 14, wherein the quantum dot laser includes a gain section and a second section that is either an absorber section or an optical waveguide section, and wherein the region of quantum dots is in the second section.

19. The circuit of claim 14, wherein the drive circuitry is configured to operate the quantum dot laser element as an actively mode-locked laser.

20. The circuit of claim 14, wherein the drive circuitry is configured to operate the quantum dot laser element as a passively mode-locked laser.

* * * * *